(12) United States Patent
de Frésart et al.

(10) Patent No.: US 7,651,918 B2
(45) Date of Patent: *Jan. 26, 2010

(54) STRAINED SEMICONDUCTOR POWER DEVICE AND METHOD

(75) Inventors: Edouard D. de Frésart, Tempe, AZ (US); Robert W. Baird, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 467 days.

This patent is subject to a terminal disclaimer.

(21) Appl. No.: 11/510,541

(22) Filed: Aug. 25, 2006

(65) Prior Publication Data

US 2008/0048257 A1 Feb. 28, 2008

(51) Int. Cl.
*H01L 21/336* (2006.01)
(52) U.S. Cl. .................. 438/273; 438/268; 438/269; 438/274; 438/912; 257/E21.418
(58) Field of Classification Search .............. 438/268, 438/269, 273, 274; 257/E21.418
See application file for complete search history.

(56) References Cited

U.S. PATENT DOCUMENTS

| 4,754,310 | A | 6/1988 | Coe |
| 5,216,275 | A | 6/1993 | Chen |
| 5,438,215 | A | 8/1995 | Tihanyi |
| 6,097,063 | A | 8/2000 | Fujihira |
| 6,274,904 | B1 | 8/2001 | Tihanyi |
| 6,291,856 | B1 | 9/2001 | Miyasaka |
| 6,475,864 | B1 * | 11/2002 | Sato et al. ............... 438/268 |
| 6,495,421 | B2 * | 12/2002 | Luo .......................... 438/269 |
| 6,750,486 | B2 * | 6/2004 | Sugawara et al. ........... 257/265 |

(Continued)

FOREIGN PATENT DOCUMENTS

JP 2003008014 A 1/2003

OTHER PUBLICATIONS

Fujihira, "Theory of Semiconductor Superjunction Devices," Jpn J. Appl. Phys., vol. 36 (1997), pp. 6254-6262.

(Continued)

*Primary Examiner*—Charles D Garber
*Assistant Examiner*—Angel Roman
(74) *Attorney, Agent, or Firm*—Ingrassia, Fisher & Lorenz, P.C.

(57) ABSTRACT

Semiconductor structures (52-9, 52-11, 52-12) and methods (100-300) are provided for a semiconductor devices employing strained (70) and relaxed (66) semiconductors, The method comprises, forming (106, 208, 308) on a substrate (54, 56, 58) first (66-1) and second (66-2) regions of a first semiconductor material (66) of a first conductivity type and a first lattice constant spaced apart by a gap or trench (69), filling (108, 210, 308) the trench or gap (69) with a second semiconductor material (70) of a second, conductivity type and a second different lattice constant so that the second semiconductor material (70) is strained with respect to the first semiconductor material (66) and forming (110, 212, 312) device regions (80, 88, S, G, D) communicating with the first (66) and second (70) semiconductor materials and adapted to provide device current (87, 87') through at least part of the strained second semiconductor material (70) in the trench (69). In a preferred embodiment, the relaxed semiconductor material is 80:20 Si:Ge and the strained semiconductor material is substantially Si.

15 Claims, 8 Drawing Sheets

50-12

U.S. PATENT DOCUMENTS

| | | | |
|---|---|---|---|
| 7,388,278 B2* | 6/2008 | Holt et al. | 257/627 |
| 7,510,938 B2* | 3/2009 | de Fresart | 438/273 |
| 7,569,437 B2* | 8/2009 | Wirbeleit et al. | 438/153 |
| 2002/0027237 A1 | 3/2002 | Onishi | |
| 2006/0216896 A1* | 9/2006 | Saito et al. | 438/270 |
| 2007/0108512 A1* | 5/2007 | Sedlmaier et al. | 257/328 |
| 2007/0228496 A1* | 10/2007 | Rochefort et al. | 257/409 |
| 2008/0050876 A1* | 2/2008 | Matocha et al. | 438/269 |
| 2008/0173969 A1* | 7/2008 | Hebert et al. | 257/488 |

OTHER PUBLICATIONS

Fujihira, and Miyasaka, "Simulated Superior Performance of Semiconductor Superjunction Devices," Proc. of 1998 Symposium on Power Semiconductor Devices & ICs, Kyoto, Japan, pp. 423-426.

Strollo and Napoli, "Optimal ON-Resistance Versus Breakdown Voltage Tradeoff in Superjunction Power Devices. A Novel Analytical Model," IEEE Transactions on Electron Devices, Vo. 48, No. 9, Sep. 2001, pp. 2161-2167.

Deboy, Gerald, "The Superjunction Principle as Enabling Technology for Advanced Power Solutions", IEEE ISIE 2005, Jun. 20-23, 2005, Dubrovnik, Croatia, pp. 469-472.

Udrea, Florin, Advanced 3D RESURF XDevices for Power integrated Circuit, IEEE, 2002, 229-238.

News Release Digest, Hitachi, Ltd., Research and Development Group, Tokyo, Japan, dated Jun. 17, 2005, "Concerning Use of Strained Silicon in Analog Semiconductor Devices".

* cited by examiner

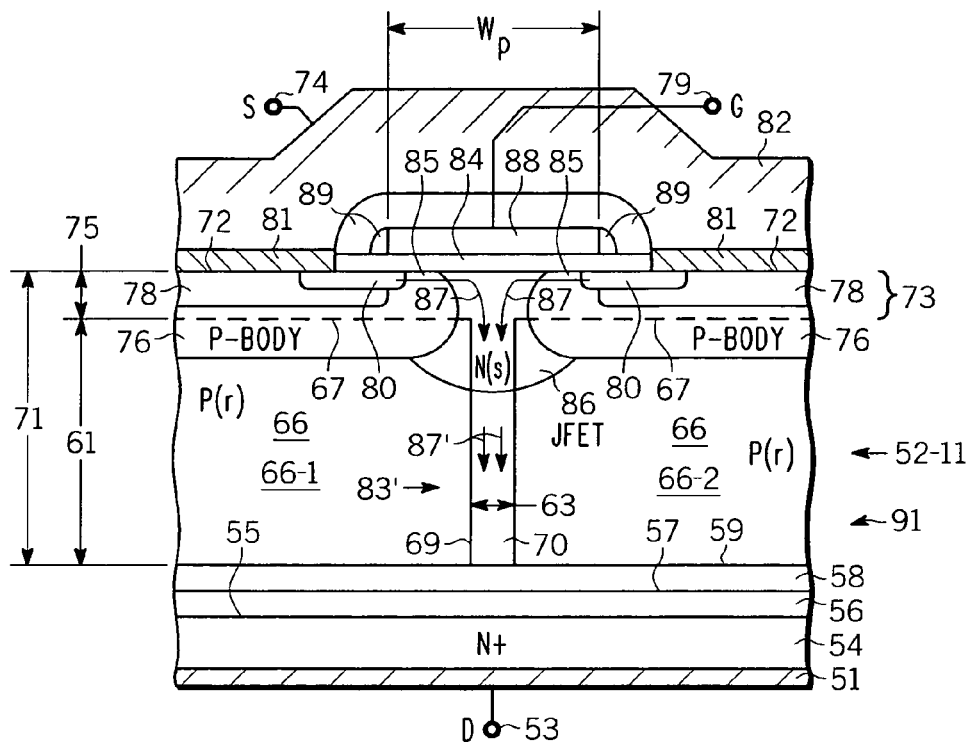
FIG. 11  50-11
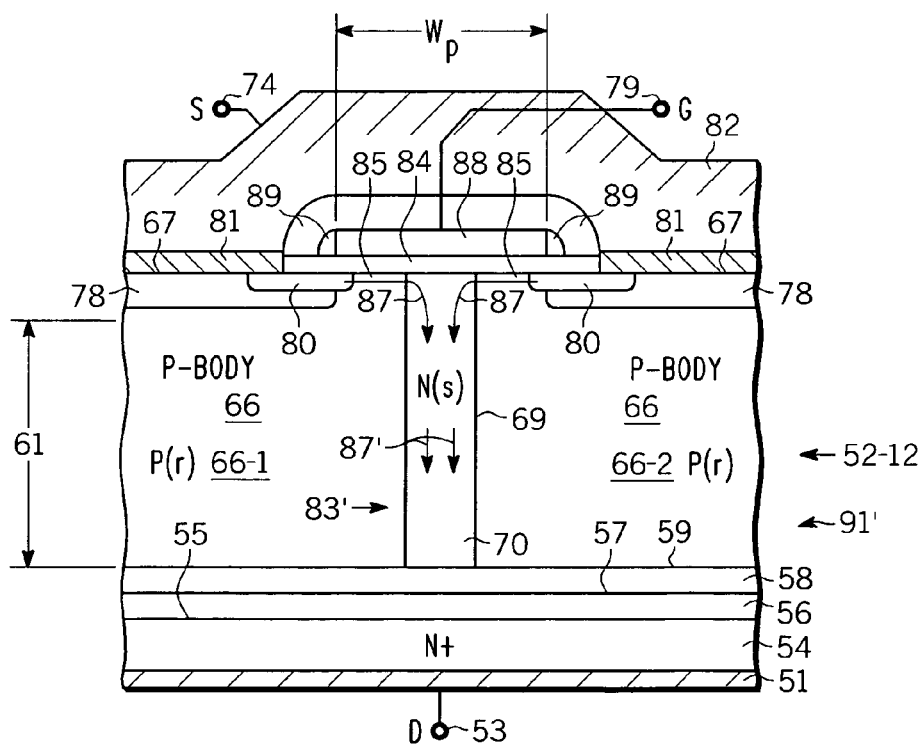
FIG. 12  50-12

STRAINED SEMICONDUCTOR POWER DEVICE AND METHOD

TECHNICAL FIELD

The present invention generally relates to semiconductor structures, and more particularly relates to device structures incorporating strained semiconductor material.

BACKGROUND

There are many applications of semiconductor (SC) devices where it is important to minimize the series ON-resistance of the device, as for example Rdson of field effect transistors. This is especially critical in devices intended for high speed and/or high frequency operation where it is also important to minimize the figure of merit=Rdson*Qg or Rdson*Qgd where Qg is the gate charge or capacitance and Qgd is the gate-drain charge or capacitance and Rdson is the series source-drain resistance of the device in the ON state.

FIG. 1 illustrates prior art vertical diffused metal-oxide-semiconductor (VDMOS) device 20 comprising N+ substrate 22, N-epi region 24, P-body regions 26 in which are provided P+ body contacts 28 and N+ source regions 30 separated from N-epi region 24 by channels 35 in P-body regions 26, gate dielectric 34 overlying channel 35 and JFET portion 36 of N-epi region 24, and gate 38 overlying gate dielectric 34. Contacts (e.g., metallization) 31 are provided for making ohmic contacts to sources 30 and body contacts 28. Contacts 31 are separated from gate 38 by dielectric sidewall spacers 39. Electrode 32 is provided to make electrical connection to contacts 31. When device 20 is appropriately biased, current 37, 37' flows from source electrode 32 through source contacts 31 to sources 30, from sources 30 through channels 35 in body regions 26 into JFET portion 36 of epi-region 24, and through carrier drift space 25 provided by the remainder of N-epi region 24 to substrate 22 which acts as the drain of VDMOS device 20. Rdson comprises the combined resistances of the various device regions through which currents 37, 37' flow.

FIG. 2 is a simplified bar chart 41 showing how the various regions of device 20 contribute to Rdson, wherein the vertical axis is the relative contribution to Rdson, expressed as percentage of the total Rdson for the various device regions listed on the horizontal axis. For example, the height of bar 42 shows the relative contribution to Rdson of contacts, 32, 31, the height of bar 43 shows the relative contribution of source regions 30, the height of bar 44 shows the relative contribution of channels 35, the height of bar 45 shows the relative contribution of JFET region 36, the height of bar 46 shows the relative contribution of drift region 25 and the height of bar 47 shows the relative contribution of substrate 22. These data were measured for a VDMOS device with Wp (see FIG. 1) of ~1.1 micro-meters and channel length Lch ~0.35 micro-meters (Lch is measured perpendicular to the plane of FIG. 1), at a gate bias $V_{GS}$ of about 4.5 volts with $V_{SD}$ of about 0.1 volts. It was found that contacts 32, 31 contributed about 1% of Rdson, source regions 30 less than 1%, channel regions 35 about 8%, JFET region 36 just under about 50%, drift region 25 about 30% and substrate 22 about 11%. This shows that JFET region 36 and drift region 25 are major contributors to Rdson in this VDMOS device. The series resistance of JFET region 36, for example, can be reduced by increasing Wp while keeping Lch constant. While this will reduce Rdson, it increases the gate-drain charge or gate-drain capacitance Qgd so that the figure of merit=Rdson*Qgd is not improved. Conversely if Wp is reduced in an attempt to improve high frequency performance by reducing Qgd, Rdson increases, which negates the effect of smaller Qgd. Accordingly, there is a need for improved device structures, materials and methods of fabrication that can provide improved performance without such adverse interactions.

Accordingly, it is desirable to provide improved device structures, especially structures that offer improved Rdson without adversely affecting Qgd, or that allows Qgd to be reduced without increasing Rdson so as to improve the figure of merit=Rdson*Qgd. Further it is desired that the structures and methods be useful with a wide array of device types and not be limited merely to VDMOS devices such as that shown in FIG. 1. It is still further desirable to provide an improved device structure and method of fabrication that is useful with a variety of semiconductor materials. It is further desirable that the methods, materials and structures employed be compatible with present day manufacturing capabilities and materials and not require substantial modifications of available manufacturing procedures or substantial increase in manufacturing costs. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

FIGS. 11-12 are simplified schematic cross-section views of a VDMOS semiconductor device structure somewhat similar to that in FIG. 9, but according to further embodiments of the present invention wherein a superjunction carrier drift space is provided.

DETAILED DESCRIPTION

Figure 1:
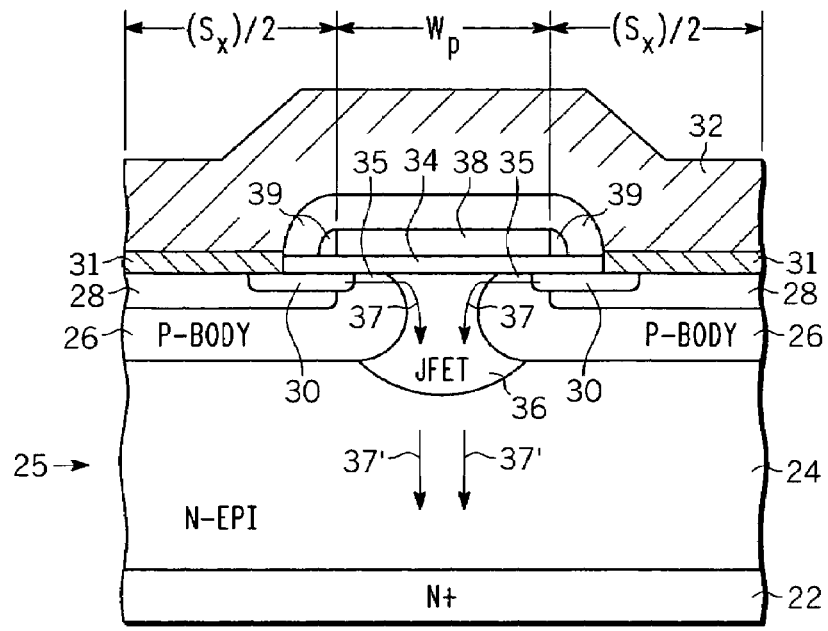
FIG. 1 is a simplified schematic cross-sectional view of a prior art VDMOS device.
Figure 2:
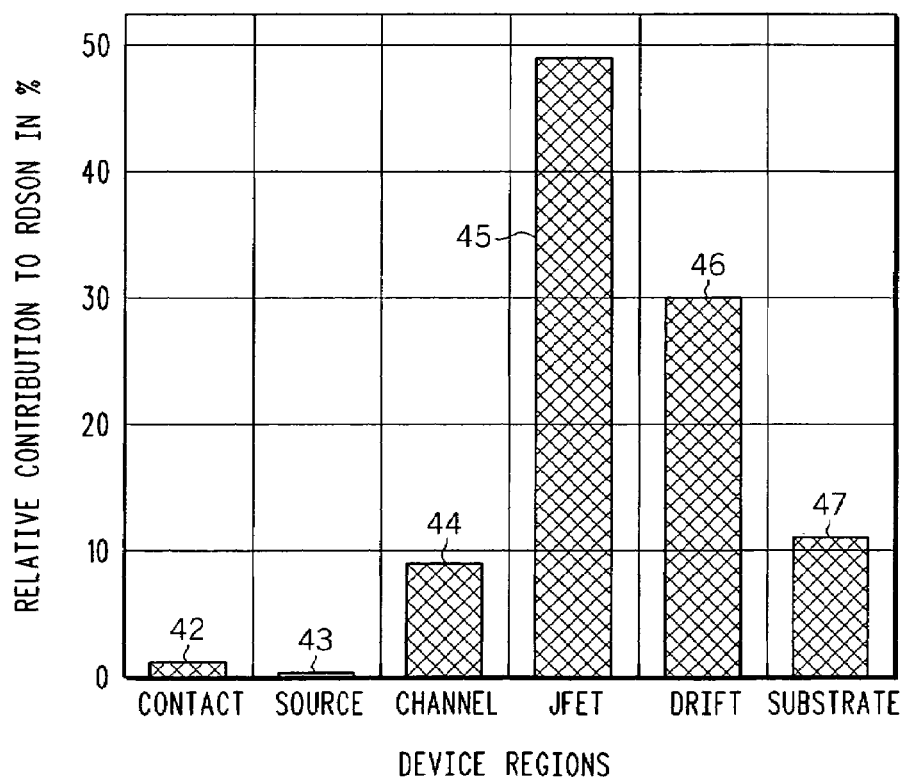
FIG. 2 is a simplified bar chart showing how various regions of the device of FIG. 1 contribute to Rdson.
Figure 3:
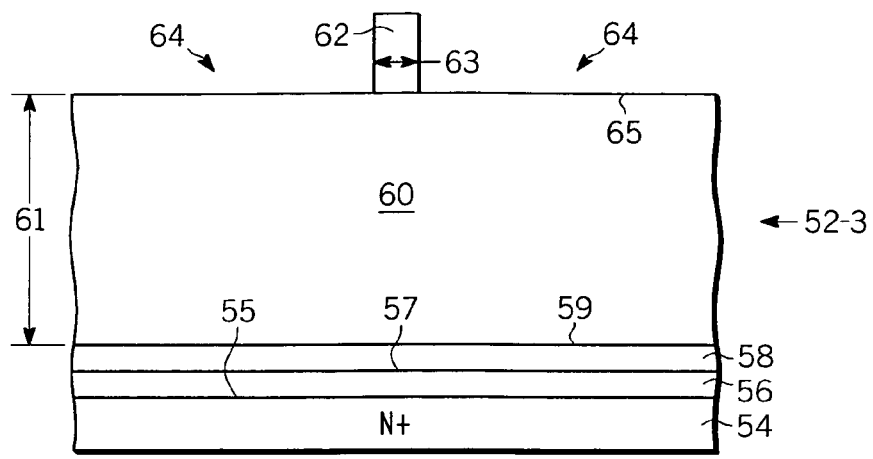
FIGS. 3-9 are simplified schematic cross-sectional views of a VDMOS semiconductor structured at different stages of manufacture according to embodiments of the present invention.
Figure 4:
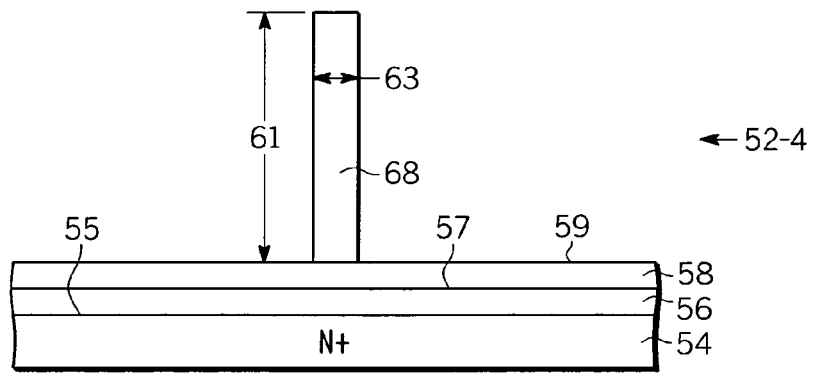

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," right," "in," "out," "front," "back," "up," "down, "top," "bottom," "over," "under," "above," "below," vertical," "horizontal" and the like in the description and the claims, if any, are used for describing relative positions and not necessarily for describing permanent positions in space. It is to be understood that the embodiments of the invention described herein may be used, for example, in other orientations than those illustrated or otherwise described herein. The term "coupled," as used herein, is defined as directly or indirectly connected in an electrical or non-electrical manner.

For convenience of explanation and not intended to be limiting, the present invention is described for structures formed using Si and Ge as exemplary semiconductor materials, but the present invention is not limited merely to this combination of materials. The principles taught herein apply to a wide variety of semiconductor materials of different lattice constants and/or band gaps that can be combined to produce strained semiconductor materials in active regions of the devices and relaxed semiconductor materials in other regions of the device. Non-limiting examples of other suitable semiconductor material combinations are GaN and Si, SiGe and GaAs, GaAs and Ge, Si and $Si_{1-y}C_y$, SiC and AlN, SiC and BP, InGaN and GaN, and various other type IV, III-V and II-VI compounds and mixtures thereof and organic semiconductors. Accordingly, while Si and SiGe are identified as a suitable pair of semiconductor materials to obtain the improved properties described herein, the present invention is not limited thereto. What is important for the present invention is that two (or more) semiconductor materials having different lattice constants are used in order to provide semiconductor materials in active regions of the device with improved mobility in order to obtain lower ON-resistance without increasing parasitic capacitance.

FIGS. 3-9 are simplified schematic cross-sectional views of VDMOS semiconductor structures 52-3 to 52-9 at different stages 50-3 to 50-9 of manufacture, according to embodiments of the present invention. For convenience of explanation, FIGS. 3-9 and 11-12 illustrate N-channel devices but this is merely by way of example and not intended to be limiting. Persons of skill in the art will understand that by interchanging the various dopant types, P-channel devices can also be made according to further embodiments of the present invention. Other types of devices can also be fabricated using the principals taught herein. Referring now to manufacturing stage 50-3 of FIG. 3, structure 52-3 comprises (e.g., N+) substrate 54 with upper surface 55 on which is formed (N-type) transition layer 56 with upper surface 57, on which is formed according to one embodiment, (e.g., N-type) relaxed semiconductor (SC) layer 58 having upper surface 59 on which is formed epi-growth mask layer 60. According to another embodiment, layer 58 may be omitted. For an N-channel device, substrate 54 is conveniently N+arsenic doped silicon of about ≦0.004 Ohm-cm resistivity with [100] oriented surface 55, but this is not essential. Other orientations and resistivities can also be used. For convenience of explanation, substrate 54 is labeled and/or referred to as N+ silicon in FIGS. 3-9 and 11-12 and associated discussion, but this is merely by way of example and not intended to be limiting. Persons of skill in the art will understand that other materials, doping types, resistivities and orientations can also be used depending upon the particular type of device desired to be formed. Transition layer 56 is conveniently SiGe having a graded concentration and lattice spacing from substantially 100% Si (or other semiconductor) at surface 55 to silicon-germanium mixtures at surface 57 with Si:Ge composition ratios usefully in the range of about 90:10 to 60:40, more conveniently about 70:30 and preferably about 80:20, and with thickness usefully in the range of about 1 to 10 micro-meters, more conveniently about 3 to 7 micro-meters, and preferably about 4 to 6 micro-meters, but thicker or thinner layers and other composition ranges can also be used. The lattice spacing changes with the composition so that the lattice spacing at surface 55 substantially matches that of surface 55 of substrate 54 and the lattice spacing at surface 59 is different and compatible with that of layer 58. Layer 58 conveniently has a (e.g., SiGe) composition substantially the same as that of surface 57 of layer 56 so that its lattice constant substantially matches that of surface 57, so that layer 58 is in a relaxed state. As used herein, the term "relaxed" is intended to indicate that the crystal lattice has the normal spacing for such material in a homogeneous crystal lattice and is not deformed. Similarly, the term "strained" is used to indicate that the crystal lattice has been deformed (e.g., stretched or compressed) from its the normal spacing for such material so that its lattice spacing is different than what would normally be encountered for such material in a homogeneous relaxed crystal. Layer 58 is desirable but not essential. Layer 58 acts as a dislocation absorption layer to absorb the dislocations resulting from the SiGe layer relaxation and ensure that the active device and depletion region (e.g., region 70 of FIG. 9) is not in contact with these dislocations, since such dislocations often result in undesirable electrical leakage. Layer 58 has a thickness usefully in the range of about 1 to 10 micro-meters, more conveniently about 1 to 5 micro-meters, and preferably about 1 to 2 micro-meters, but thinner and thicker layers can also be used. Layers 56 and 58 are conveniently formed by conventional vapor phase or molecular beam epitaxy, but other techniques may also be used. Low pressure chemical vapor deposition (LPCVD) is preferred. Epi-growth mask 60 of thickness 61 is conveniently formed on upper surface 59 of layer 58, or on upper surface 57 of layer 56 if layer 58 is omitted. Silicon dioxide is a non-limiting example of a convenient material for epi-growth mask 60, but other materials adapted to withstand subsequent process steps may also be used. Low temperature oxide (LTO), Silicon nitride and oxide formed using tetra-ethyl-ortho-silicate (TEOS) are non-limiting examples of other suitable materials. Chemical vapor deposition (CVD) or low pressure chemical vapor deposition (LPCVD) or plasma enhanced chemical vapor deposition (PECVD) are examples of suitable techniques for forming epi-growth mask 60, but other formation techniques are not precluded. CVD is preferred. Etch mask 62, of for example photo-resist, with lateral width 63 and openings 64 is provided on outer surface 65 of epi-growth mask 60. Structure 52-3 results. In manufacturing stage 50-4 of FIG. 4, epi-growth mask 60 is etched in openings 64, leaving behind pillar 68 of epi-growth mask 60. It is desirable to use a selective etch process that preferentially etches substantially perpendicular to surface 65 rather than isotropically so as to leave pillar 68 of substantially uniform width 63 and height 61 on surface 59 of layer 58, or on surface 57 of layer 56 if layer 58 is omitted. Plasma enhanced etching in an example of a well-known suitable technique useful for etching epi-growth mask 60 while leaving underlying semiconductor regions 58 or 56 substantially unaffected. Structure 52-4 results.

Figure 5:
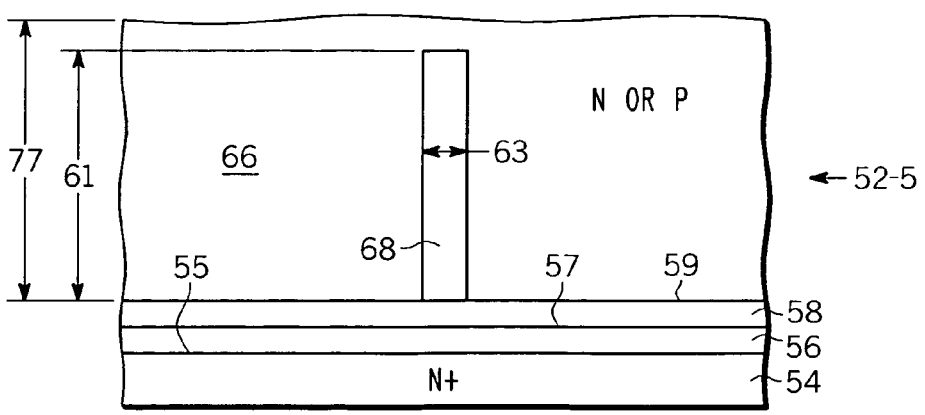
Figure 6:
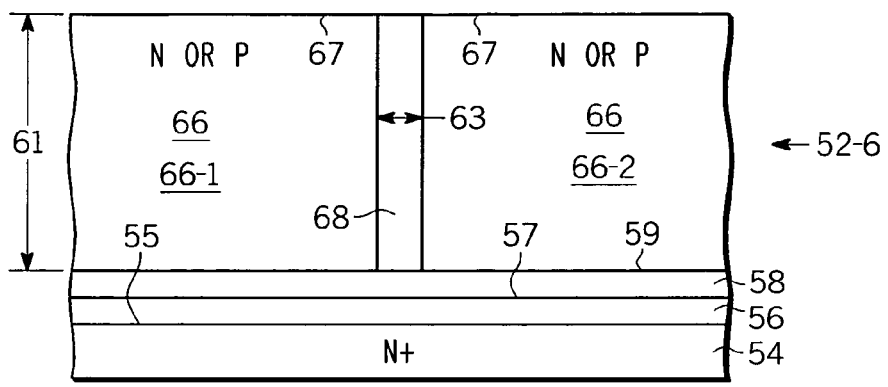
Figure 7:
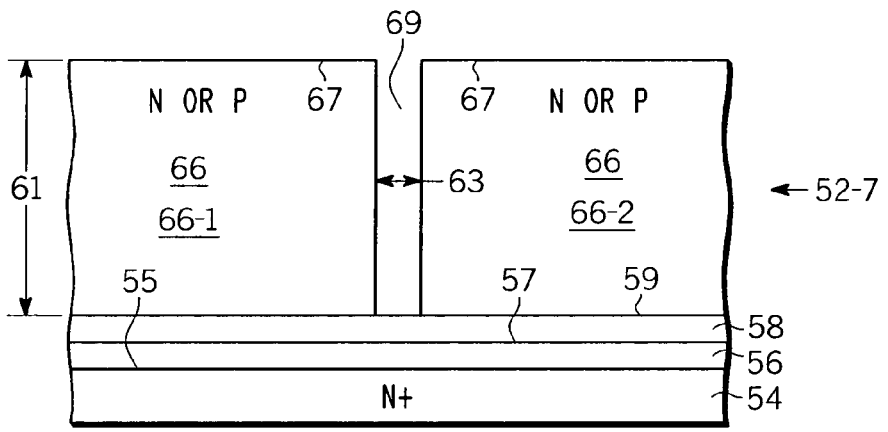

Referring now to manufacturing stage 50-5 of FIG. 5, semiconductor region 66 is preferably deposited on surface 59 of layer 58, to thickness 77 preferably exceeding thickness or height 61. Region 66 may be N or P type depending upon the particular device structure that is desired. Doping densities are conventionally determined by the sustaining voltage required by the device application, according to the well known breakdown voltage of P/N junction diode theory. Region 66 is preferably in-situ doped during formation or doped after formation using conventional doping techniques. Either arrangement is useful depending upon the type of device being formed and whether graded or uniform doping is desired. Persons of skill in the art will understand how to choose appropriate doping densities and profiles for region 66 depending upon the particular type of device they intend to fabricate. It is important that region 66 is a relaxed semiconductor. SiGe is a non-limiting example of a suitable material. It should have substantially the same composition as layer 58 or upper surface 57 of layer 56. As noted earlier, Si:Ge ratios in the range of about 90:10 to 60:40 are useful, with about 70:30 being convenient and about 80:20 being preferred. Selective epitaxial deposition is a preferred means of forming region 66. Structure 52-5 results. In manufacturing stage 50-6 of FIG. 6, structure 50-5 is planarized so as to have a thickness or height substantially about equal to height 61 of pillar 68 of epi-growth mask 60. Regions 66-1 and 66-2 collectively illustrate region 66 subsequent to planarization. Chemical-mechanical polishing (CMP) is an example of a well known suitable planarization technique. Other techniques can also be used. Structure 52-6 results. While it is preferred to form layer 60 with thickness 77 exceeding height 61, this is not essential since in planarization step 50-6 whichever of layer 60 or pillar 68 is higher can be lapped back so that structure 52-6 is obtained. Either arrangement is useful. For convenience of description, it is assumed herein that thickness 77 exceeds height 61, but this is not intended to be limiting. In manufacturing stage 50-7 of FIG. 7, structure 52-6 is selectively etched to remove pillar 68, thereby leaving behind trench 69 substantially of width 63 and height 61, extending from surface 59 of layer 58 or surface 57 of layer 56 when layer 58 is omitted, to surface 67 of region 66. Structure 52-7 results.

Figure 8:
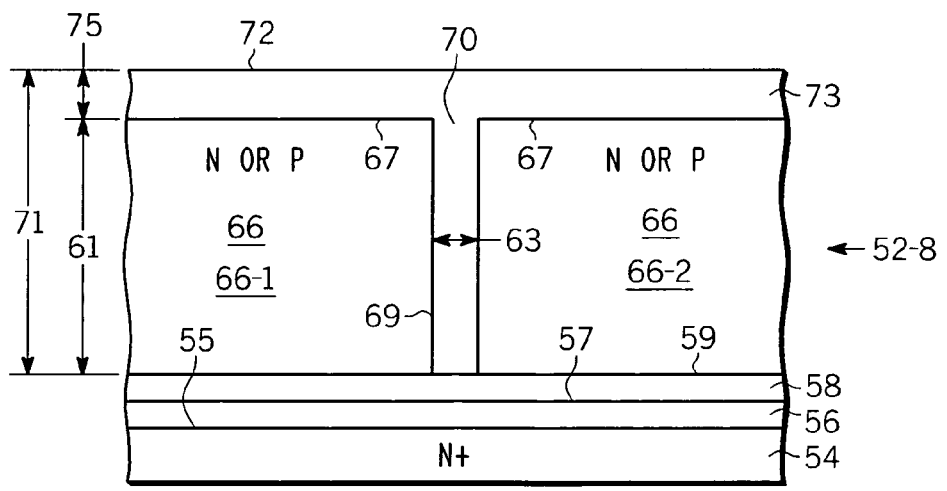

In manufacturing stage 50-8 of FIG. 8, higher mobility, e.g., strained, semiconductor material 70 is epitaxially deposited in trench 69 on surface 59 of layer 58 (or surface 57 of layer 56) of structure 52-7, preferably to thickness or height 71 exceeding height 61 so as to provide overlap region 73 of thickness 75 above surface 67 of regions 66. Vapor phase epitaxy or molecular beam epitaxy are examples of suitable deposition techniques. LPCVD is preferred. Substantially pure silicon is a non-limiting example of a suitable semiconductor (SC) for material 70 that will be strained relative to relaxed SiGe SC material of regions 66. Material 70 may be N or P type depending upon the type of finished device that is desired. For an N-channel device, material 70 is preferably N-type with a doping density close to that of layer 66, preferably substantially identical to that of layer 66. Overlap region 73 thickness 75 that should be less than the relaxation limit. The relaxation limit, is determined by the maximum stress that the layer can sustain before relaxation. If thickness 75 exceeds the relaxation limit, then there is a risk that layer 70 may relax. If layer 70 relaxes, then dislocations can form leading to electrical leakage and loss of the desired mobility enhancement associated with the strain. When substantially pure silicon is used for layer 70, the relaxation limit is about 70-100 nanometers when formed on 80:20 Si:Ge. Higher or lower values may occur when formed on other mixtures. Persons of skill in the art will understand how to determine the relaxation limit for the particular material combinations they are using. Thus, thickness 75 should be less than this value. Depending upon the planarity obtained for upper surface 72 of material 70, material 70 may be used as-is following deposition or it may be grown to a thickness greater than thickness 71 but less than the relaxation limit and lapped back, e.g. by CMP, to thickness 71 so that overlap region 73 has final thickness 75 and substantially planar upper surface 72. Either arrangement is useful. Persons of skill in the art will be able to determine without undue experimentation whether such a lap-back step is needed. Structure 52-8 results.

Figure 9:
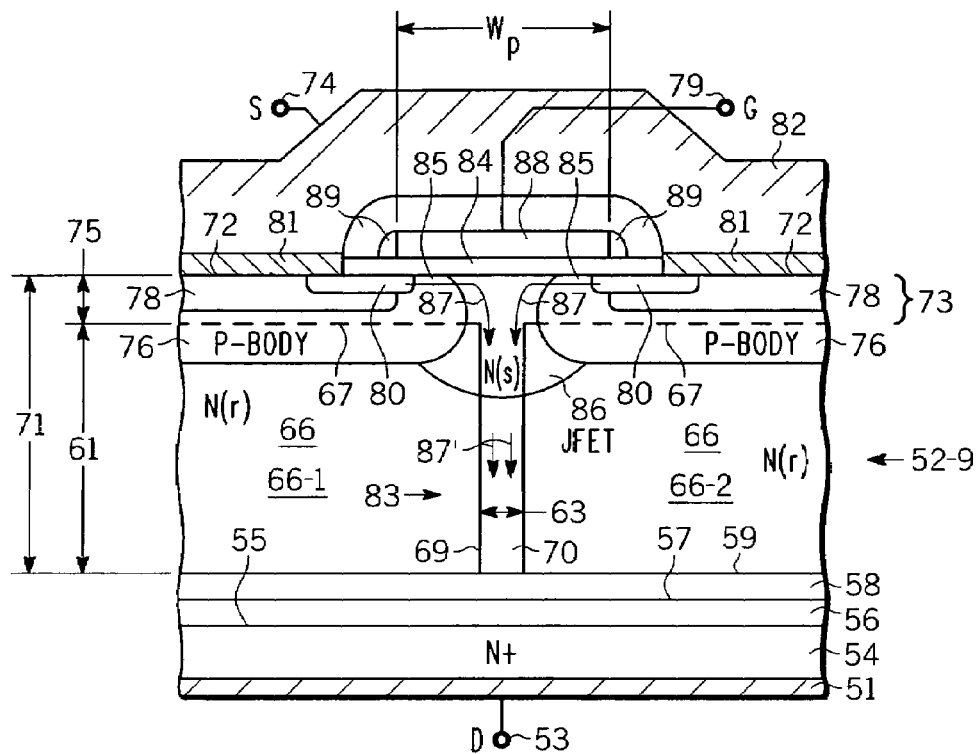

Manufacturing stage 50-9 of FIG. 9 illustrates how structure 52-8 of FIG. 8 may be used to form N-channel VDMOS device 52-9 having improved properties compared to device 20 of FIG. 1. For the case of device 52-9, region 66 is N-type, and is identified in FIG. 9 as "N(r)" meaning formed of a relaxed N-type semiconductor, e.g., SiGe. Material 70 in trench 69 and overlap region 73 is identified as "N(s)" meaning that material 70 in trench 69 and overlap region 73 is a formed of strained N-type semiconductor material, e.g., Si. It is the lattice mismatch between regions 66 and material 70 (and between surface 59 (or 57) and material 70), that creates the strain in material 70 during epitaxial growth in trench 69 and overlap region 73, and that provides the carrier mobility enhancement that improves the electrical performance of the device. P− Body regions 76 analogous to regions 26 of FIG. 1 are formed extending from surface 72 into N(r) regions 66, P+ body contacts 78 analogous to regions 28 of FIG. 1 are formed extending from surface 72 into region N(r) region 73, N+ source regions 80 analogous to regions 30 of FIG. 1 are formed extending from surface 72 into N(r) region 73, gate dielectric 84 is formed above channel regions 85 and surface 72 of N(s) region 73 between body regions 76, and gate 88 is formed above gate dielectric 84. Ion implantation is a non-limiting example of a suitable technique for forming regions 76, 78, 80 with a dose of about 1E13 to 1E14 per square centimeter being suitable for region 76, about 1E15 to 4E15 per centimeter square being suitable for region 78, and about 2E15 to 5E15 per centimeter square being suitable for region 80. Thermally grown or deposited silicon oxide of about 100 to 1000 Angstrom Units thickness is conveniently used for gate dielectric 84. Doped polycrystalline silicon is suitable for gate 88, but other conductors can also be used. Dielectric side-wall spacers 89 of e.g., TEOS, analogous to spacers 39 of FIG. 1 separate gate 88 from source-body contacts 81 of e.g., Ti/TiN analogous to source-body contacts 31 of FIG. 1. Source-body electrode 82 of for example AlSiCu analogous to electrode 32 of FIG. 1 is provided in electrical communication with source-body contacts 81. Electrical connection 74 is provided to source-body electrode 82, electrical connection 79 is provided to gate 88 and electrical connection 53 and drain electrode 51 are provided to substrate (drain) 54. Regions 76, 78, 80, gate dielectric 84, gate 88, contacts 81 and electrode 82 are analogous to elements 26, 28, 30, 34, 38, 31 and 32 of device 20 of FIG. 1, and are formed using materials, means and arrangements well known in the art. What is different is the nature of material 70 and regions 73 and 66 in or on which the foregoing regions are being formed. When device 52-9 is appropriately biased, current 87, 87' flows from source electrode 82 through source contacts 81 to sources 80, from sources 80 through channels 85 in body regions 76 into JFET portion 86 of N(s) material 70, and through carrier drift space 83 provided by the remainder of N(s) material 70, and through layer 58 if included and layer 56 to substrate 54 which acts as the drain of improved VDMOS device 52-9. Rdson comprises the combined resistances of the various device regions through which currents 87, 87' of FIG. 9 flow, analogous to currents 37, 37' of FIG. 1.

Figure 10:
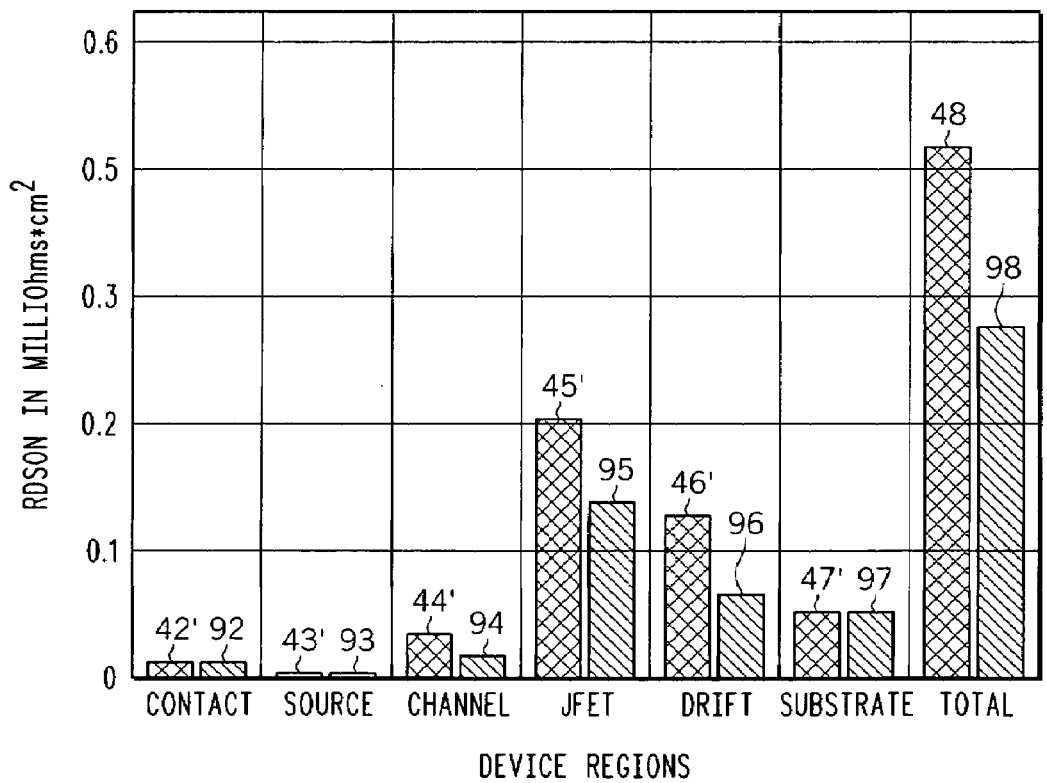
FIG. 10 is a simplified bar graph showing Rdson in milliohm*cm² of various device regions for the prior art device of FIG. 1 compared to the improved device of FIG. 9 according to an embodiment of the present invention.

FIG. 10 is simplified bar graph 90 showing Rdson in milliohm*cm2 of various device regions for device 52-9 of FIG. 9 compared to device 20 of FIG. 1. For example, the height of bar 42' shows the contribution to Rdson of contacts, 32, 31 of device 20 of FIG. 1, the height of bar 43' shows the contribution of source regions 30, the height of bar 44' shows the contribution of channels 35, the height of bar 45' shows the contribution of JFET region 36, the height of bar 46' shows the contribution of drift region 25, the height of bar 47' shows the contribution of substrate 22 and the height of bar 48 shows the total Rdson of device 20 of FIG. 1. By comparison, the height of bar 92 shows the contribution to Rdson of contacts, 82, 81 of device 52-9 of FIG. 9, the height of bar 93 shows the contribution of source regions 80, the height of bar 94 shows the contribution of channels 85, the height of bar 95 shows the contribution of JFET region 86, the height of bar 96 shows the contribution of drift region 83, the height of bar 97 shows the contribution of substrate 54 and layers 56, 58, and the height of bar 98 shows the total Rdson of device 52-9 of FIG. 9. Devices 20 and 52-9 had similar dimensions (e.g., Wp=1.1 and channel length Lch=~0.35 micrometers) and were operated at similar voltages. It is readily apparent that the series resistance of channels 85, JFET region 86 and drift region 83 of improved device 52-9 of FIG. 9 are significantly reduced compared to counterpart regions 35, 36 and 25 of prior art device 20 of FIG. 1. Total Rdson of improved device 52-9 of FIG. 9 shown by bar 98 is approximately one-third less than total Rdson of prior art device 20 of FIG. 1 shown by bar 48, for substantially the same geometry (and therefore substantially the same values of Qgd). Thus, a corresponding improvement in the figure of merit=Rdson*Qgd is also obtained. This provides a significant improvement in overall device performance for the same occupied area, or allows similar performance to be obtained in a smaller device area, thereby reducing overall device cost, or a combination thereof. These are significant advantages over the prior art.

FIG. 11 is a simplified schematic cross-section view showing manufacturing stage 50-11 of VDMOS semiconductor device 52-11 somewhat similar to device 52-9 of FIG. 9, but according to a further embodiment of the present invention wherein superjunction structure 91 is provided. Device 52-10 is fabricated through substantially the same sequence of manufacturing stages 50-3 through 50-8 as device 52-9 except that regions 66-1, 66-2 (collectively 66) are relaxed P-type rather than N-type. P-doping densities of regions 66 of FIG. 11 are usefully in the range of about 5E16 per cm³. In contrast to device 52-9 of FIG. 9, the sustaining voltage of device 52-11 of FIG. 11 is not controlled by the doping levels of P/N diode junction of P-body 76 and N(r) regions 66, but by the thickness of the P(r) regions 66. Accordingly, in FIG. 11, regions 66 are identified as P(r) having upper surface 67. P-body regions 76, P-body contact regions 78, source regions 80, source contacts 81, gate dielectric 84, channels 85, gate 88, sidewall spacers 89, and source-body electrode 82 are formed in otherwise substantially the same manner as for device 52-9 of FIG. 9. The most significant difference between devices 52-9 and 52-11 is that having relaxed P-type (e.g., P(r)) regions 66-1, 66-2 (collectively 66) extend completely through drift region 83' between surface 67 and layer 58 (or 56) on either side of N(s) material 70 in trench 69 creates superjunction structure 91, wherein drain current 87, 87' flows preferentially through N(s) SC material 70 between P-regions 66-1, 66-2. Superjunction structure 91 has the property of spreading out the drain-source voltage drop more uniformly across drift region 83' thereby improving the breakdown voltage of the device for the same drift region height or thickness 61. This means that, for the same breakdown voltage, thickness 61 can be made smaller and the doping level higher, thereby reducing the contribution to Rdson of drift region 83' and improving overall device performance. This is a further significant advantage over the prior art and can be applied in combination with the advantages provided by the use of strained semiconductor for material 70 in trench 69 and overlap region 73.

FIG. 12 is a simplified schematic cross-section view showing manufacturing stage 50-12 of VDMOS semiconductor device 52-12 somewhat similar to device 52-9 of FIG. 9, but according to a further embodiment of the present invention wherein superjunction structure 91' is provided. Device 52-12 is fabricated through substantially the same sequence of manufacturing stages 50-3 through 50-8 as device 52-9 except that regions 66-1, 66-2 (collectively 66) are relaxed P-type rather than N-type, and structure 52-8 of FIG. 8 is desirably lapped back to surface 67. P-doping densities of regions 66-1, 66-2 of FIG. 12 are usefully in the range of about 5E15 to 1E18 per cm³, more conveniently about 5E16 to 1E18 per cm³, and preferably about 1E17 to 5E17 per cm³. Accordingly, in FIG. 12, regions 66-1, 66-2 are identified as P(r) having upper surface 67. Since regions 66-1, 66-2 are P-type, it is not necessary to implant P-body regions 76 as was done in connection with device 52-9 of FIG. 9 and 52-11 of FIG. 11. However, P-body contact regions 78, source regions 80, source contacts 81, gate dielectric 84, channels 85, gate 88, sidewall spacers 89, and source-body electrode 82 are formed in otherwise substantially the same manner as for device 52-9 of FIG. 9. The most significant difference between devices 52-9 and 52-11 is that having P-body regions 66-1, 66-2 extend completely through drift region 83' between surface 67 and layer 58 (or 56) on either side of N(s) material 70 in trench 69 creates superjunction structure 91', wherein drain current 87, 87' flows preferentially through N(s) SC material 70 in trench 69 between P-body regions 66-1, 66-2. Superjunction structure 91' has the property of spreading out the drain-source voltage drop more uniformly across drift region 83' thereby improving the breakdown voltage of the device for the same drift region height or thickness 61. This means that, for the same breakdown voltage, thickness 61 can be made smaller, thereby reducing the contribution to Rdson of drift region 83' and improving overall device performance. This is a further significant advantage over the prior art and can be applied in combination with the advantages provided by the use of strained semiconductor material 70 in trench 69.

Figure 13:
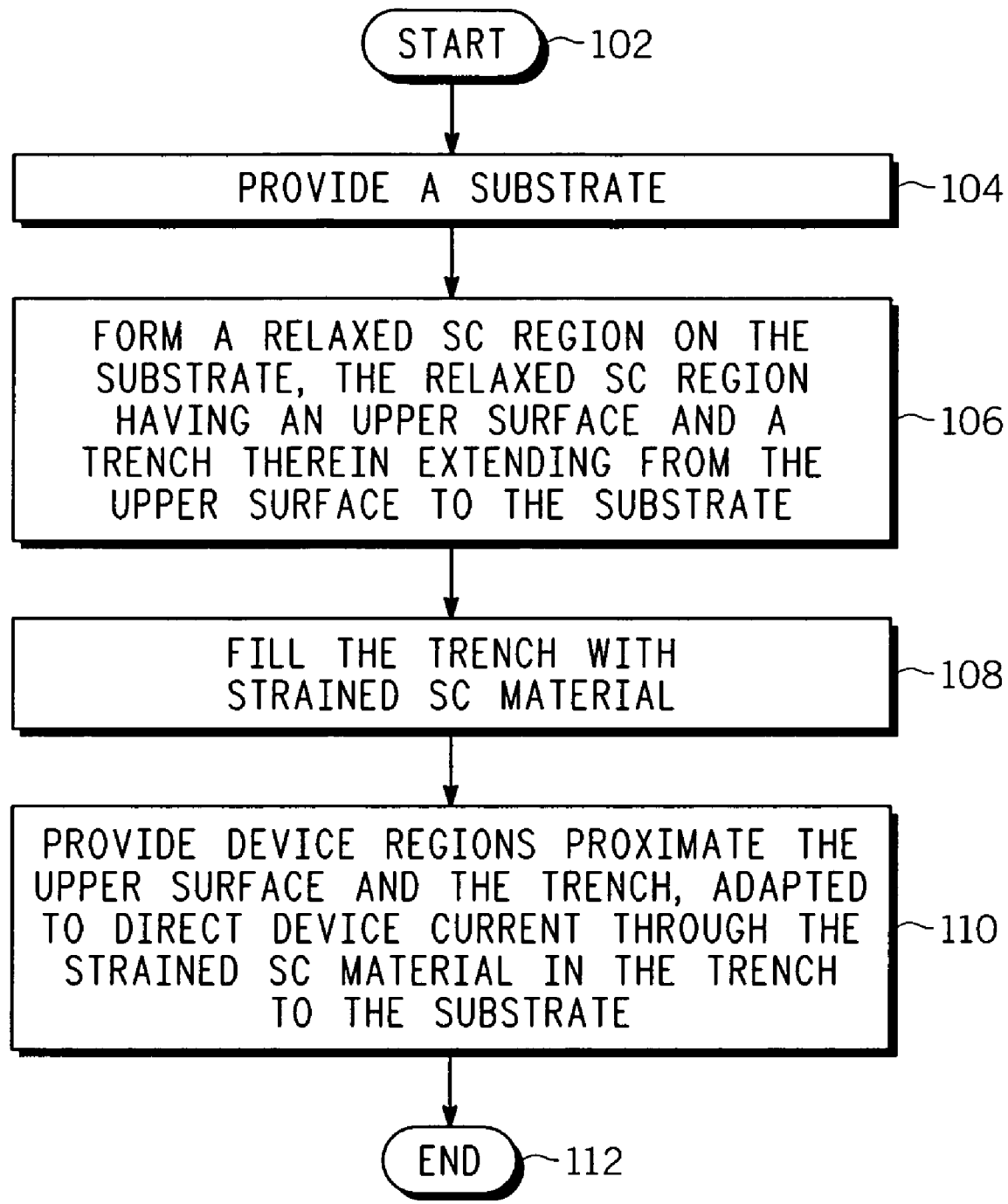
FIGS. 13-15 are simplified flow diagrams illustrating methods for forming the structures illustrated, for example, in FIGS. 3-9 and 11-12, according to still further embodiments of the present invention.
Figure 14:
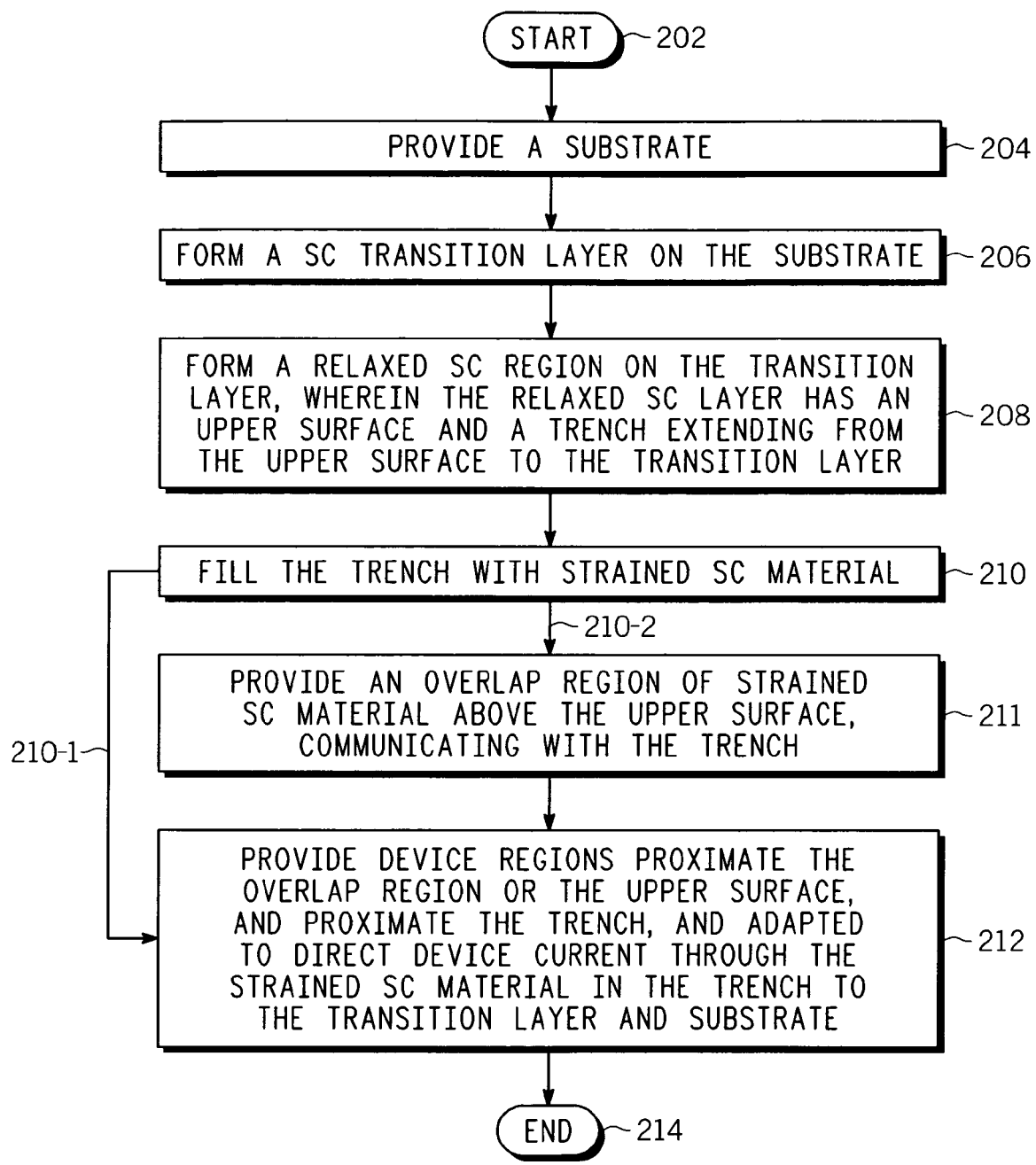
Figure 15:
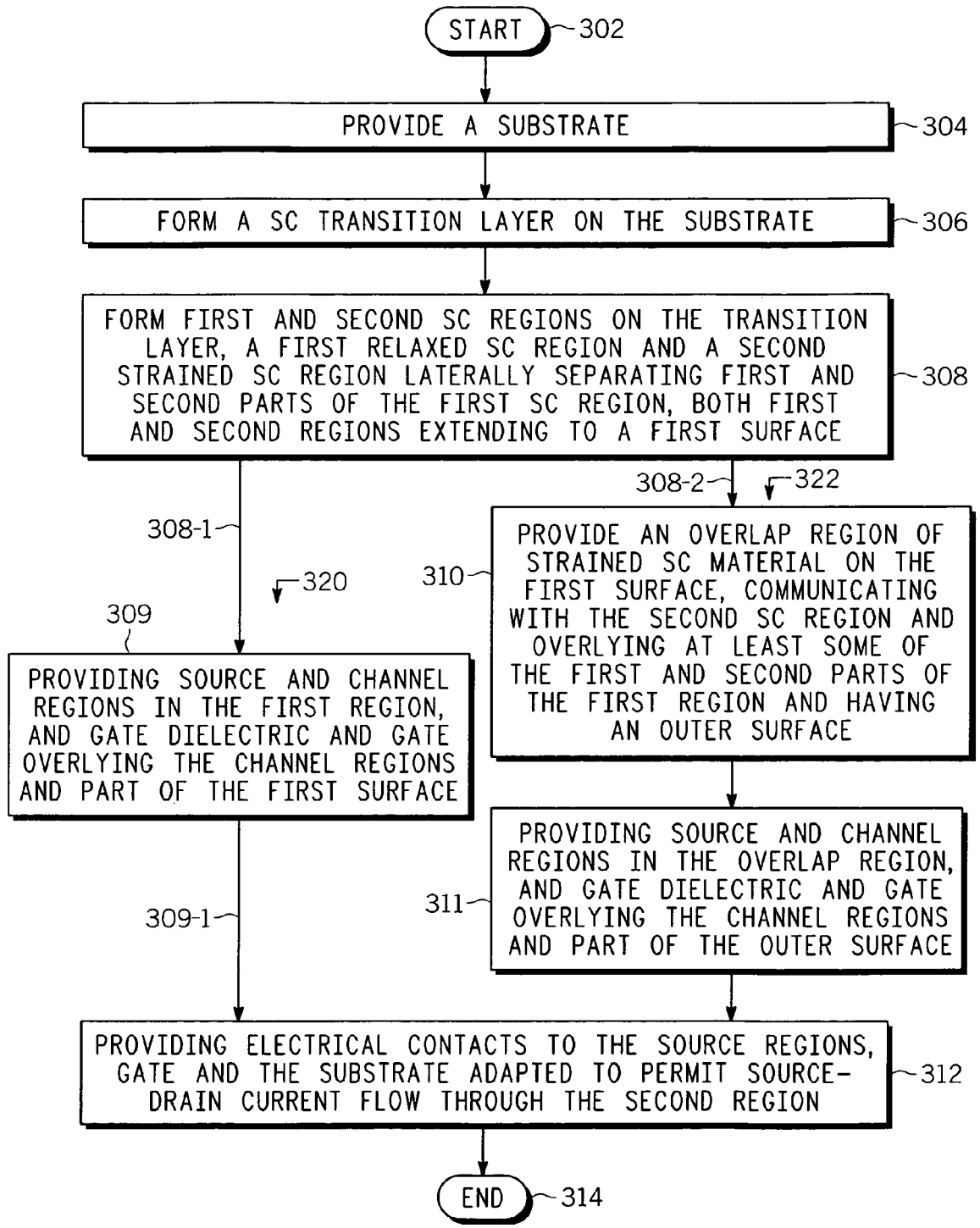

FIGS. 13-15 are simplified flow diagrams illustrating methods 100-300 for forming the structures illustrated in FIGS. 3-9 and 11-12, in increasing detail and according to still further embodiments of the present invention. Referring now to FIG. 13, method 100 begins with START 102 and initial PROVIDE A SUBSTRATE step 104 (e.g., substrate 54, 56 and optionally 58 of FIG. 3). In step 106 (encompassing for example manufacturing stages 50-3 through 50-7 or equivalent), a relaxed semiconductor (SC) region (e.g., region 66) is formed on the substrate with a trench therein (e.g., trench 69), extending to the upper surface of the substrate (e.g., surface 57 or 59). In step 108 the trench (e.g. 69) is filled with a strained semiconductor (SC) material (e.g., material 70 of FIG. 8). In subsequent step 110, device regions (e.g., sources 80, gate dielectric 84, gate 88, etc. of FIG. 9, 11-12) are provided proximate the upper surface (e.g., surface 67 or 72) and the trench (e.g., trench 69). Such device regions are adapted to direct device current (e.g., 87, 87') through the strained semiconductor (SC) material (e.g., material 70) in the trench (e.g., trench 69) to the substrate (e.g., 54, 56 and optionally 58). Method 100 then proceeds to END 112. Persons of skill in the art will understand in connection with FIGS. 13-15, that various conventional post-processing steps may be employed to add electrodes, interconnections, passivation layers, mounting, encapsulation, etc., at the convenience of the user.

Referring now to FIG. 14, method 200 begins with START 202 and initial PROVIDE A SUBSTRATE step 204 (e.g. substrate 54). In step 206, corresponding in part to manufacturing stage 50-3, a semiconductor transition layer (e.g., layer 56) is provided on the substrate (e.g., 54). Layer 58 may also be included in a further embodiment. In step 208 analogous to step 106 of method 100, a relaxed semiconductor region (e.g., region 66) is formed on the transition layer (e.g., on layer 56 or 56, 58) with an upper surface (e.g., 67) and a trench (e.g., 69) extending from the supper surface (e.g., 67) to the transition layer (e.g., 56 or 56, 58). In step 210, the trench (e.g., 69) is filled with a strained semiconductor (SC) material (e.g., material 70). Following step 210, method 200 may proceed, according to different embodiment, directly to step 212 via path 210-1 or indirectly to step 212 via path 210-2 and step 211. Via pathway 210-2 and step 211, an overlap region (e.g., region 73) of strained SC material (e.g., material 70) is provided above the upper surface (e.g., surface 67) communicating with the trench (e.g., trench 69). Via pathway 210-1, such overlap region is not provided. Then method 200 proceeds to step 212 wherein, device regions (e.g., source 80, gate dielectric 84, gate 88, etc.,) are provided adapted to direct device current (e.g., 87, 87') through the strained semiconductor (SC) material (e.g., 70) in the trench (e.g., 69) to the transition layer (e.g., 56 or 56, 58) and the substrate (e.g., substrate 54). For fabrication proceeding via pathway 210-1, since there is no overlap region, in step 212 the device regions are located proximate the upper surface (e.g., 67) and the trench (e.g., 69), as for example is illustrated in structure 52-12 of FIG. 12. For fabrication proceeding via pathway 210-2 and step 211, in step 212 the device regions are located proximate the overlap region (e.g., 73) and the trench (e.g., 69), as for example are illustrated in structures 52-9 and 52-11 of FIGS. 9, 11.

Referring now to FIG. 15, method 300 begins with START 302 and initial PROVIDE A SUBSTRATE step 304 analogous to step 204 of method 200. As noted earlier, the substrate (e.g., 54) is conveniently single crystal silicon, but other materials and material combinations may also be used, including semiconductor-on-insulator (SOI) structures. In step 306, corresponding in part to manufacturing stage 50-3, a semiconductor transition layer (e.g., layer 56) is provided on the substrate (e.g., 54). According to a further embodiment, layer 58 may also be included. In step 308, first (e.g., 66) and second (e.g., 70) semiconductor (SC) regions or materials are formed on the transition layer (e.g., 56, or 56, 58), a first relaxed SC region (e.g., region 66) and a second region (in trench 69) of strained SC material (e.g., material 70), wherein the second strained SC region (e.g., material 70 in 69) separates first (e.g., 66-1) and second (e.g., 66-2) parts of the first SC region (e.g., 66). Both the first (e.g., 66) and second (e.g., 70 in 69) SC regions extend to a first surface (e.g., 67). Method 300 then has two alternate pathways 320 or 322 according to different embodiments, i.e., pathway 320 comprising links or steps 308-1, 309 and 312, wherein device structures of the type generally illustrated, for example in FIG. 12, can be formed, or pathway 322 comprising links or steps 308-2, 310, 311 and 312, wherein device structures of the type generally illustrated, for example in FIGS. 9 and 11, can be formed. According to pathway 320, step 309 is performed wherein source region (e.g., 80) and channel regions (e.g., 85) are provided in the first SC region (e.g., 66) and gate dielectric (e.g., 84) and gate (e.g., 88) are provided overlying the channel regions (e.g., 85) and part of the first surface (e.g., 67). According to pathway 322, step 310 is performed wherein an overlap region (e.g., 73) of strained material (e.g., material 70) is provided on the first surface (e.g., 67) and communicating with the second semiconductor region (e.g., 70 in 69) and overlying at least some of the first (e.g., 66-1) and second (e.g., 66-2) parts of the first SC region (e.g., 66), and having an outer surface (e.g., 72). Pathway 322 then proceeds to step 311 wherein there are provided source regions (e.g., 80) and channel regions (e.g., 85) in the overlap region (e.g., 73) and gate dielectric (e.g., 84) and gate (e.g., 88) overlying the channel regions (e.g., 85) and part of the outer surface (e.g., 72). Following step 309 or 311, method 300 proceeds to step 312 wherein there are provided electrical contacts (e.g., S, G, D) to the source regions (e.g., 80), gate (88) and the substrate (e.g., 54), adapted to permit source-drain current 87, 87' to flow though the second region (material 70 in trench 69).

According to a first embodiment, there is provided a method for forming a semiconductor (SC) device embodying a strained semiconductor, comprising, providing a substrate, forming over the substrate a relaxed semiconductor region having an outer surface and a trench therein extending from the outer surface to the substrate, filling the trench with a strained semiconductor material, providing device regions proximate the outer surface and the trench adapted to direct device current through the strained semiconductor material in the trench to the substrate. In a further embodiment, prior to the forming step, providing a transition layer adapted to lie between an upper surface of the substrate and the relaxed semiconductor region and having a first lattice spacing adjacent the upper surface of the substrate and a second different lattice spacing adjacent the relaxed semiconductor region. In a still further embodiment, the first lattice spacing substantially matches the lattice spacing of the upper surface of the substrate and the second lattice spacing substantially matches the lattice spacing of the relaxed semiconductor region. In a yet further embodiment, the relaxed semiconductor region comprises SiGe and the strained semiconductor material is substantially silicon. In a still further embodiment, the substrate is single crystal silicon and the relaxed semiconductor region comprises SiGe in a ratio in the range of about 90:10 to 60:40 Si:Ge. In a still yet further embodiment, the method further comprises, prior to the forming step, providing a transition layer between the substrate and the relaxed semiconductor region having a Si:Ge composition ration of about 100:0 adjacent the substrate and about 80:20 adjacent the relaxed semiconductor region. In a yet still further embodiment, the step of providing device regions proximate the outer surface and the trench, comprises, providing spaced-apart source regions in spaced apart portions of the relaxed semiconductor lying on either side of the trench at the outer surface, providing a gate dielectric on the outer surface extending between the source regions, and providing a gate overlying the gate dielectric and the trench at the outer surface. IN another embodiment, the method comprises, providing a drain contact on the substrate for receiving device current originating from the source regions and flowing through the strained semiconductor material in the trench.

According to a second embodiment, there is provided a semiconductor device, comprising, a substrate, first and second relaxed semiconductor regions located on the substrate and separated by a trench extending from the substrate to an upper surface of the first and second relaxed semiconductor regions, strained semiconductor material filling the trench between the first and second relaxed semiconductor regions, in contact with the substrate and having an upper end proximate the upper surface of the first and second relaxed semiconductor regions, spaced-apart source regions located proximate the upper surface on either side of the upper end of the trench, gate dielectric above the upper surface, extending at least between the spaced-apart source regions over the upper end of the trench, a gate over the gate dielectric, a drain contact coupled to the substrate, wherein device current flowing from the sources to the substrate in response to signals applied to the gate, passes through the strained semiconductor material. In a further embodiment, the relaxed semiconductor regions comprise SiGe and the strained semiconductor consists substantially of silicon. In a still further embodiment, the device further comprises, a conductive transition region located between the substrate and the relaxed semiconductor regions, and having a composition adjacent the substrate whose lattice constant substantially matches that of the substrate and having a composition adjacent the relaxed semiconductor regions whose lattice constant substantially matches that of the relaxed semiconductor regions. In a still further embodiment, the device further comprises, an overlap region of the strained semiconductor material overlying the upper surface and communicating with the trench, wherein the overlap region has an outer surface, and wherein the spaced-apart source regions are formed in the overlap region and the gate dielectric lies above the outer surface. In a yet further embodiment, the device further comprises, spaced-apart doped body regions of opposite conductivity type to the strained semiconductor material located in the relaxed semiconductor regions on either side of the trench and extending to the upper surface, and wherein the spaced-apart source regions are located in doped body regions.

According to a third embodiment, there is provided a method for forming VDMOS devices, comprising, providing a substrate having a first surface and a first composition at the first surface, forming a transition layer having a composition at the first surface substantially matching the first composition and having a different second composition at a second surface opposed to the first surface, forming a relaxed semiconductor on the second surface, having a composition substantially matching the second composition, having a third surface opposite the second surface, and having two spaced-apart portions separated by a trench extending from the third surface to the second surface, providing a strained semiconductor in the trench in contact with the second surface and extending to a fourth surface substantially coplanar with the third surface or above and substantially parallel with the third surface, and forming device regions with sources and a gate proximate the fourth surface and straddling the trench and a drain coupled to the substrate, adapted to cause device current to flow from the sources to the drain via the strained semiconductor in the trench. In a further embodiment, the relaxed semiconductor comprises SiGe with a Si:Ge ratio in the range of about 90:10 to 60:40 and the strained semiconductor comprises silicon with negligible germanium therein. In a still further embodiment, the Si:Ge ratio is about 80:20. In a yet further embodiment, the step of providing a strained semiconductor comprises, providing a strained semiconductor in the trench and in an overlap region extending over at least part of the two spaced-apart portions of the relaxed semiconductor, so that the fourth surface is above and substantially parallel with the third surface, and the step of forming the device regions comprises, forming the sources in and the gate over the overlap region. In a yet still further embodiment, the step of providing a strained semiconductor comprises, providing a strained semiconductor in the trench so that the fourth surface is substantially coplanar with the third surface, and the step of forming the device regions comprises, forming the sources in and the gate over the third surface. In an another embodiment, the first composition at the first surface is substantially silicon and the second composition at the second surface is substantially SiGe with Si:Ge ratio in the range of about 90:10 to about 60:40. In yet still another embodiment, the method further comprises providing a dislocation absorption layer between the transition layer and the relaxed and strained semiconductor, having substantially the same composition as the second composition.

While at least one exemplary embodiment has been presented in the foregoing detailed description, it should be appreciated that a vast number of variations exist, especially with respect to choices of device types and materials. The above-described invention is especially useful for formation of VDMOS devices, but persons of skill in the art will understand based on the description here in that other types of devices can also be fabricated using the principles described herein. For example, and not intended to be limiting, the present invention is useful for fabrication of diode, bipolar, thyristor, insulated gate bipolar transistor (IGBT), and gate controlled thyristor (GCT) devices as well as those described herein. Further, while Si and SiGe are provided as examples of suitable materials for use in combination to produce the adjacent relaxed and strained semiconductor regions described herein, this is merely be way of example and not intended to be limiting. The following is a non-limiting list of other suitable semiconductor materials that can be used in combination to achieve analogous relaxed and strained regions in a superjunction configuration, specifically: GaN and Si, SiGe and GaAs, GaAs and Ge, Si and $Si_{1-y}C_y$, SiC and AlN, SiC and BP, InGaN and GaN, and so forth. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for forming a semiconductor (SC) device embodying a strained semiconductor, comprising:
   providing a substrate;
   forming over the substrate a relaxed semiconductor region having an outer surface and a trench therein extending from the outer surface to the substrate;
   filling the trench with a strained semiconductor material, wherein the strained semiconductor material includes a material having a crystal lattice that has been deformed from a normal spacing for the material so that a lattice spacing of the material is different from what would normally be encountered for the material in a homogeneous relaxed crystal; and providing device regions proximate the outer surface and the trench adapted to direct device current through the strained semiconductor material in the trench to the substrate.

2. The method of claim 1, wherein the step of providing device regions proximate the outer surface and the trench, comprises:
providing spaced-apart source regions in spaced apart portions of the relaxed semiconductor lying on either side of the trench at the outer surface;
providing a gate dielectric on the outer surface extending between the source regions; and
providing a gate overlying the gate dielectric and the trench at the outer surface.

3. The method of claim 2, further comprising, providing a drain contact on the substrate for receiving device current originating from the source regions and flowing through the strained semiconductor material in the trench.

4. A method for forming a semiconductor (SC) device embodying a strained semiconductor, comprising:
providing a substrate;
providing a transition layer adapted to lie between an upper surface of the substrate and a relaxed semiconductor region and having a first lattice spacing adjacent the upper surface of the substrate and a second different lattice spacing adjacent the relaxed semiconductor region;
forming over the transition layer the relaxed semiconductor region having an outer surface and a trench therein extending from the outer surface to the transition layer;
filling the trench with a strained semiconductor material; and
providing device regions proximate the outer surface and the trench adapted to direct device current through the strained semiconductor material in the trench to the transition layer and the substrate.

5. The method of claim 4, wherein the first lattice spacing substantially matches the lattice spacing of the upper surface of the substrate and the second lattice spacing substantially matches the lattice spacing of the relaxed semiconductor region.

6. A method for forming a semiconductor (SC) device embodying a strained semiconductor, comprising:
providing a substrate;
forming over the substrate a relaxed semiconductor region having an outer surface and a trench therein extending from the outer surface to the substrate, wherein the relaxed semiconductor region comprises SiGe;
filling the trench with a strained semiconductor material, wherein the strained semiconductor material is substantially silicon; and
providing device regions proximate the outer surface and the trench adapted to direct device current through the strained semiconductor material in the trench to the substrate.

7. The method of claim 6, wherein the substrate is single crystal silicon and the relaxed semiconductor region comprises SiGe in a ratio in the range of about 90:10 to 60:40 Si:Ge.

8. The method of claim 7, further comprising:
prior to the forming step, providing a transition layer between the substrate and the relaxed semiconductor region having a Si:Ge composition ration of about 100:0 adjacent the substrate and about 80:20 adjacent the relaxed semiconductor region.

9. A method for forming VDMOS devices, comprising:
providing a substrate having a first surface and a first composition at the first surface;
forming a transition layer having a composition at the first surface substantially matching the first composition and having a different second composition at a second surface opposed to the first surface;
forming a relaxed semiconductor on the second surface, having a composition substantially matching the second composition, having a third surface opposite the second surface, and having two spaced-apart portions separated by a trench extending from the third surface to the second surface;
providing a strained semiconductor in the trench in contact with the second surface and extending to a fourth surface substantially coplanar with the third surface or above and substantially parallel with the third surface; and
forming device regions with sources and a gate proximate the fourth surface and straddling the trench and a drain coupled to the substrate, adapted to cause device current to flow from the sources to the drain via the strained semiconductor in the trench.

10. The method of claim 9, wherein the relaxed semiconductor comprises SiGe with a Si:Ge ratio in the range of about 90:10 to 60:40 and the strained semiconductor comprises silicon with negligible germanium therein.

11. The method of claim 10, wherein the Si:Ge ratio is about 80:20.

12. The method of claim 9, wherein:
the step of providing a strained semiconductor comprises, providing a strained semiconductor in the trench so that the fourth surface is substantially coplanar with the third surface; and
the step of forming the device regions comprises, forming the sources in and the gate over the third surface.

13. The method of claim 9, wherein the first composition at the first surface is substantially silicon and the second composition at the second surface is substantially SiGe with Si:Ge ratio in the range of about 90:10 to about 60:40.

14. The method of claim 9, further providing a dislocation absorption layer between the transition layer and the relaxed and strained semiconductor, having substantially the same composition as the second composition.

15. A method for forming VDMOS devices, comprising:
providing a substrate having a first surface and a first composition at the first surface;
forming a transition layer having a composition at the first surface substantially matching the first composition and having a different second composition at a second surface opposed to the first surface;
forming a relaxed semiconductor on the second surface, having a composition substantially matching the second composition, having a third surface opposite the second surface, and having two spaced-apart portions separated by a trench extending from the third surface to the second surface;
providing a strained semiconductor in the trench in contact with the second surface and extending to a fourth surface substantially coplanar with the third surface or above and substantially parallel with the third surface, wherein the strained semiconductor is provided in the trench and in an overlap region extending over at least part of the two spaced-apart portions of the relaxed semiconductor, so that the fourth surface is above and substantially parallel with the third surface; and
forming device regions with sources and a gate proximate the fourth surface and straddling the trench and a drain coupled to the substrate, wherein the sources are formed in and the gate is formed over the overlap region, and the device regions are adapted to cause device current to flow from the sources to the drain via the strained semiconductor in the trench.

* * * * *

UNITED STATES PATENT AND TRADEMARK OFFICE
CERTIFICATE OF CORRECTION

PATENT NO. : 7,651,918 B2
APPLICATION NO. : 11/510541
DATED : January 26, 2010
INVENTOR(S) : de Frésart et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 621 days.

Signed and Sealed this

Twenty-third Day of November, 2010

David J. Kappos
*Director of the United States Patent and Trademark Office*